(12) United States Patent
Ito et al.

(10) Patent No.: US 10,462,947 B2
(45) Date of Patent: Oct. 29, 2019

(54) COMPONENT MOUNTING MACHINE

(71) Applicant: FUJI CORPORATION, Chiryu (JP)

(72) Inventors: Hidetoshi Ito, Okazaki (JP); Yoshihiro Yasui, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 672 days.

(21) Appl. No.: 15/025,064

(22) PCT Filed: Oct. 31, 2013

(86) PCT No.: PCT/JP2013/079601
§ 371 (c)(1),
(2) Date: Mar. 25, 2016

(87) PCT Pub. No.: WO2015/063934
PCT Pub. Date: May 7, 2015

(65) Prior Publication Data
US 2016/0249497 A1    Aug. 25, 2016

(51) Int. Cl.
*H05K 13/04* (2006.01)
*H05K 13/00* (2006.01)
(Continued)

(52) U.S. Cl.
CPC ......... *H05K 13/04* (2013.01); *H05K 13/0015* (2013.01); *H05K 13/02* (2013.01);
(Continued)

(58) Field of Classification Search
CPC ............... H05K 13/08; H05K 13/0408; H05K 13/0404; H05K 13/04; H05K 13/0413;
(Continued)

(56) References Cited

U.S. PATENT DOCUMENTS 4,794,689 A * 1/1989 Seno .................... H05K 13/082
                                                         29/740
4,979,286 A * 12/1990 Nakayama ......... H05K 13/0413
                                                         29/740
(Continued)

FOREIGN PATENT DOCUMENTS

EP    2 760 264 A1    7/2014
EP    2 822 373 A1    1/2015
(Continued)

OTHER PUBLICATIONS

Extended European Search Report dated Sep. 15, 2016 in Patent Application No. 13896565.2.
(Continued)

*Primary Examiner* — Peter Dungba Vo
*Assistant Examiner* — Kaying Kue
(74) *Attorney, Agent, or Firm* — Oblon, McClelland, Maier & Neustadt, L.L.P.

(57) ABSTRACT

Provided are a first component holding tool operating device which operates one component holding tool which is positioned at a first position set on one circumference among the plurality of component holding tools for holding and disengaging a component, and a second holding tool operating device which operates one component holding tool which is positioned at a second position set on the circumference among the plurality of component holding tools for holding and disengaging the component. The first position and the second position are set so that the second position is positioned in the middle of two adjacent component holding tools among the plurality of component holding tools when one of the plurality of component holding tools is positioned at the first position.

10 Claims, 11 Drawing Sheets

(51) Int. Cl.
  *H05K 13/02* (2006.01)
  *H05K 13/08* (2006.01)
(52) U.S. Cl.
  CPC ....... *H05K 13/041* (2018.08); *H05K 13/0413* (2013.01); *H05K 13/085* (2018.08)
(58) Field of Classification Search
  CPC .. H05K 13/0015; H05K 13/02; H05K 13/041; H05K 13/085; Y10T 29/53174–53183; Y10T 29/53191
  USPC ................... 29/743, 739–741, 759, 832, 833
  See application file for complete search history.

(56) References Cited

U.S. PATENT DOCUMENTS

| | | | | |
|---|---|---|---|---|
| 5,060,366 A * | 10/1991 | Asai | ............ | H05K 13/041 29/739 |
| 5,377,405 A * | 1/1995 | Sakurai | ............ | H05K 13/041 29/833 |
| 5,579,572 A * | 12/1996 | Kashiwagi | ............ | H05K 13/041 29/836 |
| 5,661,239 A * | 8/1997 | Takeuchi | ............ | H05K 13/041 73/432.1 |
| 5,926,950 A * | 7/1999 | Asai | ............ | H05K 13/0812 29/832 |
| 6,073,342 A * | 6/2000 | Asai | ............ | H05K 13/0061 29/740 |
| 6,131,276 A * | 10/2000 | Hirotani | ............ | H05K 13/08 29/832 |
| 6,230,393 B1 * | 5/2001 | Hirano | ............ | H05K 13/04 29/740 |
| 6,374,484 B1 * | 4/2002 | Yoshida | ............ | H05K 13/085 29/740 |
| 6,494,671 B1 * | 12/2002 | Takaiti | ............ | H05K 13/021 414/809 |
| 6,594,887 B1 * | 7/2003 | Okuda | ............ | H05K 13/0434 29/739 |
| 6,681,468 B1 * | 1/2004 | Uchiyama | ............ | H05K 13/0015 29/407.01 |
| 6,931,716 B2 * | 8/2005 | Suhara | ............ | H05K 13/0812 29/740 |
| 7,036,215 B2 * | 5/2006 | Kodama | ............ | H05K 13/0069 29/740 |
| 7,050,623 B1 * | 5/2006 | Fukuda | ............ | H05K 13/0813 382/151 |
| 7,337,533 B2 * | 3/2008 | Imafuku | ............ | H05K 13/0413 29/739 |
| 7,353,589 B2 * | 4/2008 | Kawasumi | ............ | H05K 13/0404 29/740 |
| 7,488,283 B2 * | 2/2009 | Yasui | ............ | H05K 13/0409 483/1 |
| 7,899,561 B2 * | 3/2011 | Maenishi | ............ | H05K 13/0853 700/28 |
| 8,782,875 B2 * | 7/2014 | Kawase | ............ | H05K 13/0061 198/340 |
| 9,844,170 B2 * | 12/2017 | Nishiyama | ............ | H05K 13/0413 |
| 2004/0139602 A1 * | 7/2004 | Saho | ............ | H05K 13/041 29/832 |
| 2004/0177494 A1 * | 9/2004 | Link | ............ | A61B 17/1757 29/743 |
| 2005/0071990 A1 * | 4/2005 | Nakamura | ............ | B41J 2/14024 29/740 |
| 2005/0115063 A1 * | 6/2005 | Saito | ............ | H05K 13/041 29/743 |
| 2006/0053624 A1 * | 3/2006 | Maeda | ............ | H05K 13/082 29/832 |
| 2006/0200973 A1 * | 9/2006 | Imafuku | ............ | H05K 13/0413 29/739 |
| 2007/0094868 A1 * | 5/2007 | Ieizumi | ............ | H05K 13/0413 29/743 |
| 2007/0214629 A1 * | 9/2007 | Imafuku | ............ | H05K 13/0413 29/434 |
| 2007/0277369 A1 * | 12/2007 | Kawazoe | ............ | H05K 13/0061 29/729 |
| 2012/0272511 A1 * | 11/2012 | Kawase | ............ | H05K 13/0061 29/592.1 |
| 2015/0040384 A1 * | 2/2015 | Nishiyama | ............ | H05K 13/0413 29/739 |
| 2016/0219761 A1 * | 7/2016 | Nishiyama | ............ | H05K 13/0404 |

FOREIGN PATENT DOCUMENTS

| | | |
|---|---|---|
| JP | 1-205500 A | 8/1989 |
| JP | 2009-38147 A | 2/2009 |
| JP | 2009-272651 A | 11/2009 |
| JP | 4420970 B2 | 2/2010 |
| JP | 2013-69798 A | 4/2013 |
| WO | WO 2013/128584 A1 | 9/2013 |

OTHER PUBLICATIONS

International Search Report dated Dec. 17, 2013 in PCT/JP13/079601 Filed Oct. 31, 2013.

* cited by examiner

[FIG. 1]
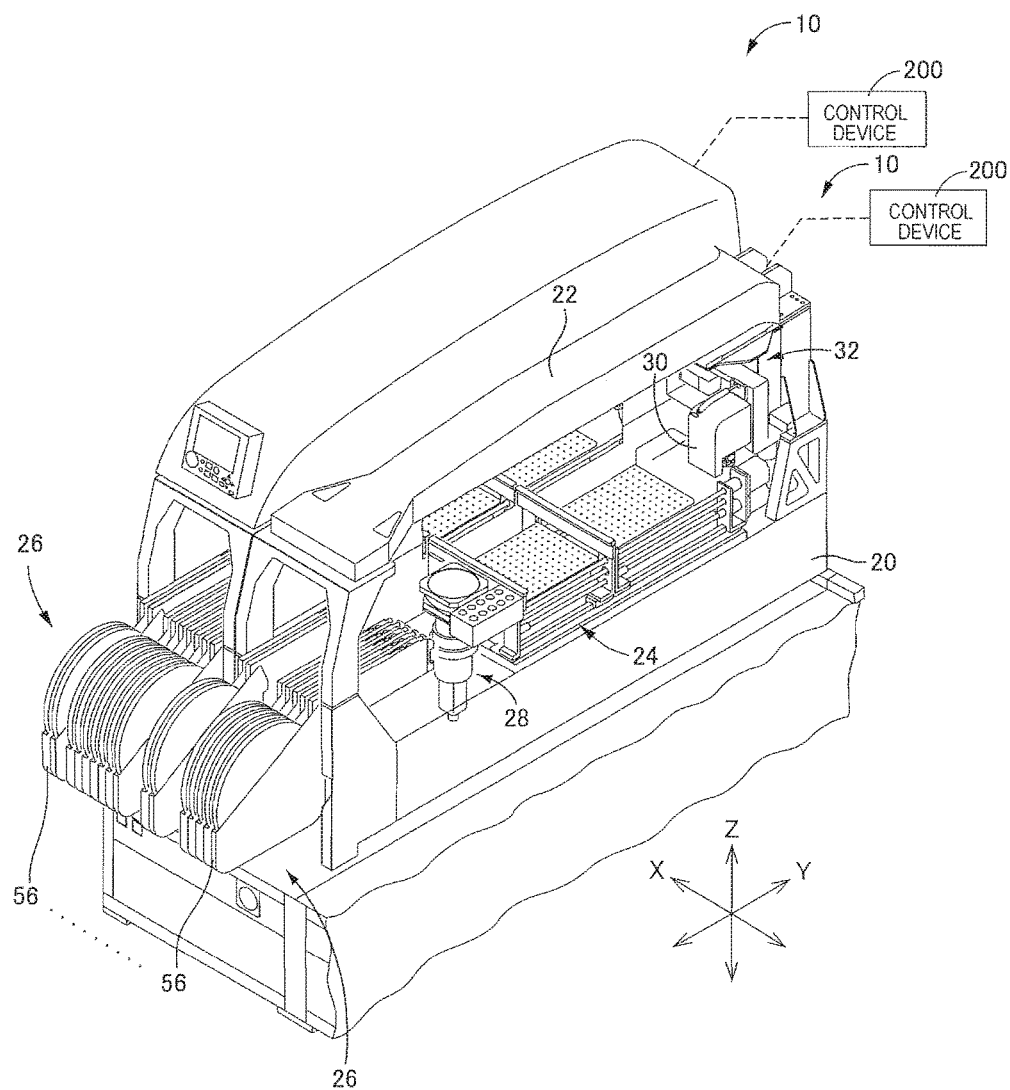

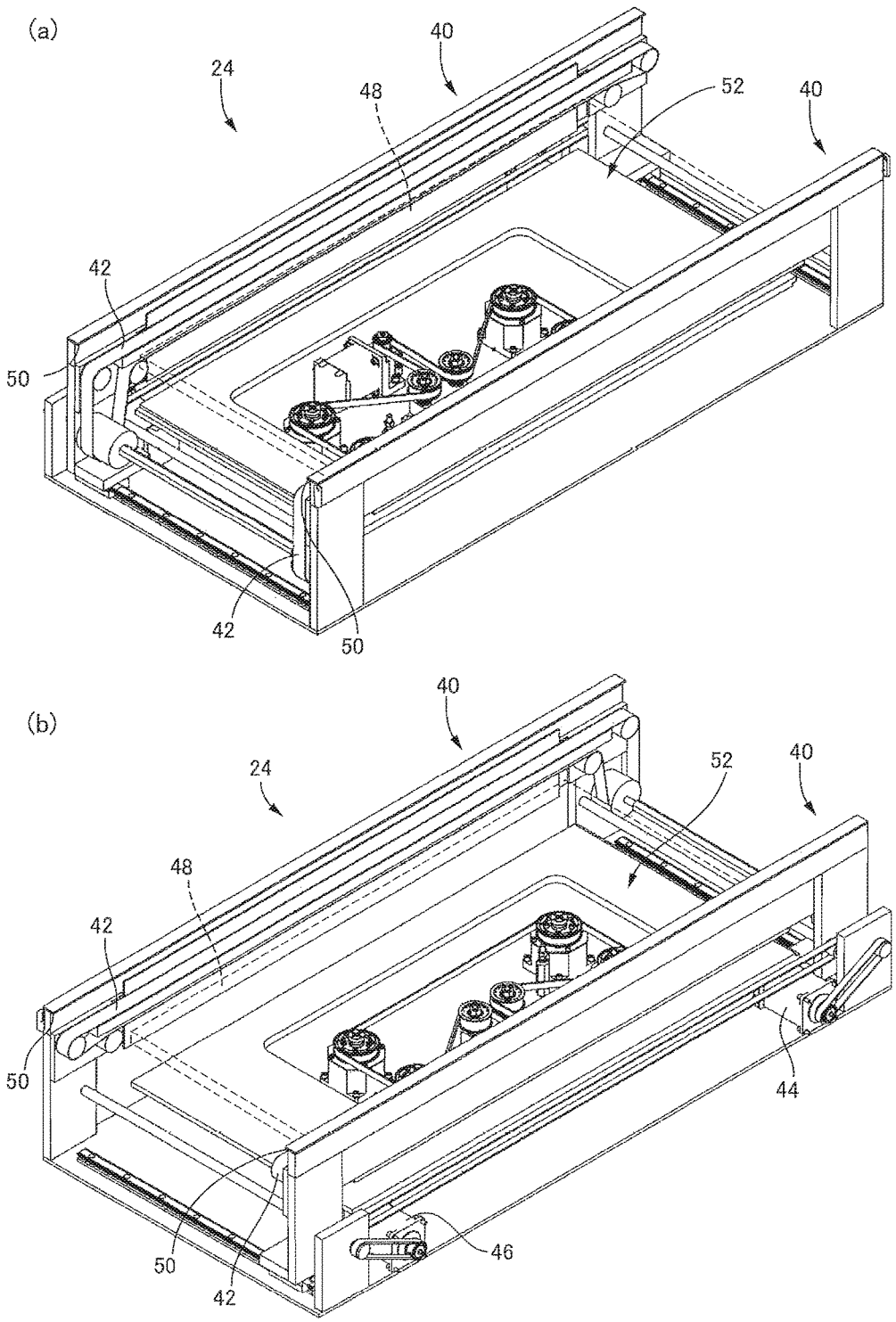
[FIG. 2]

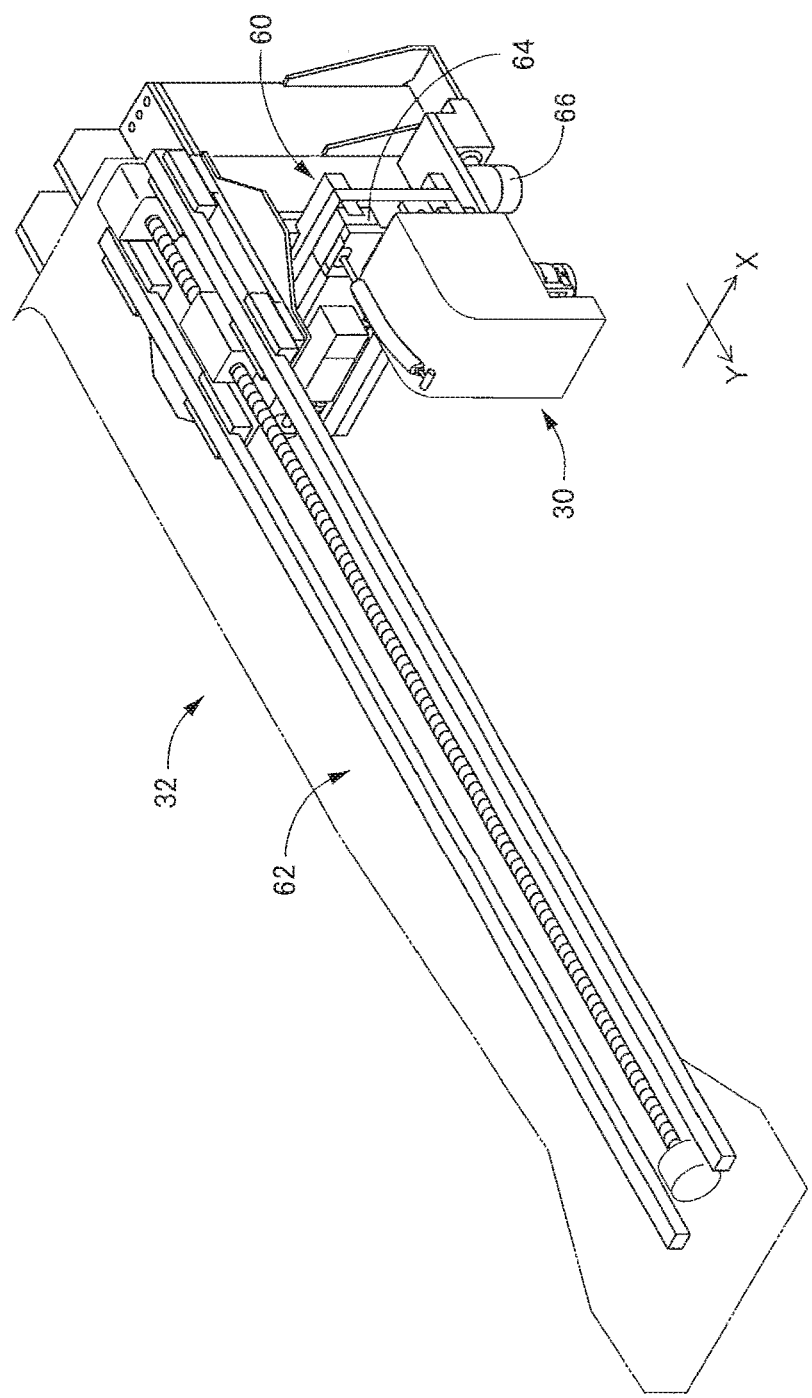
[FIG. 3]

[FIG. 4]
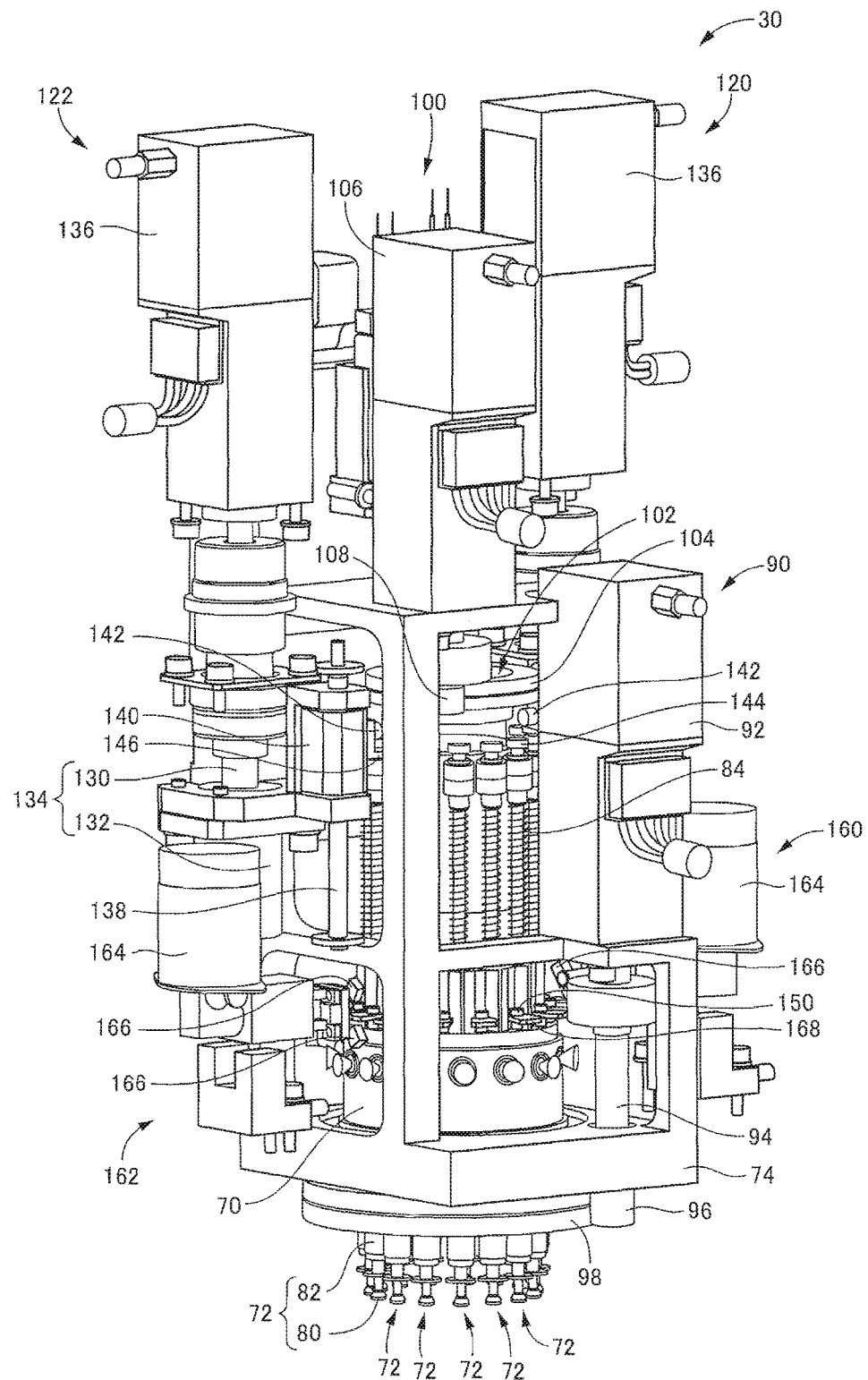

[FIG. 5]
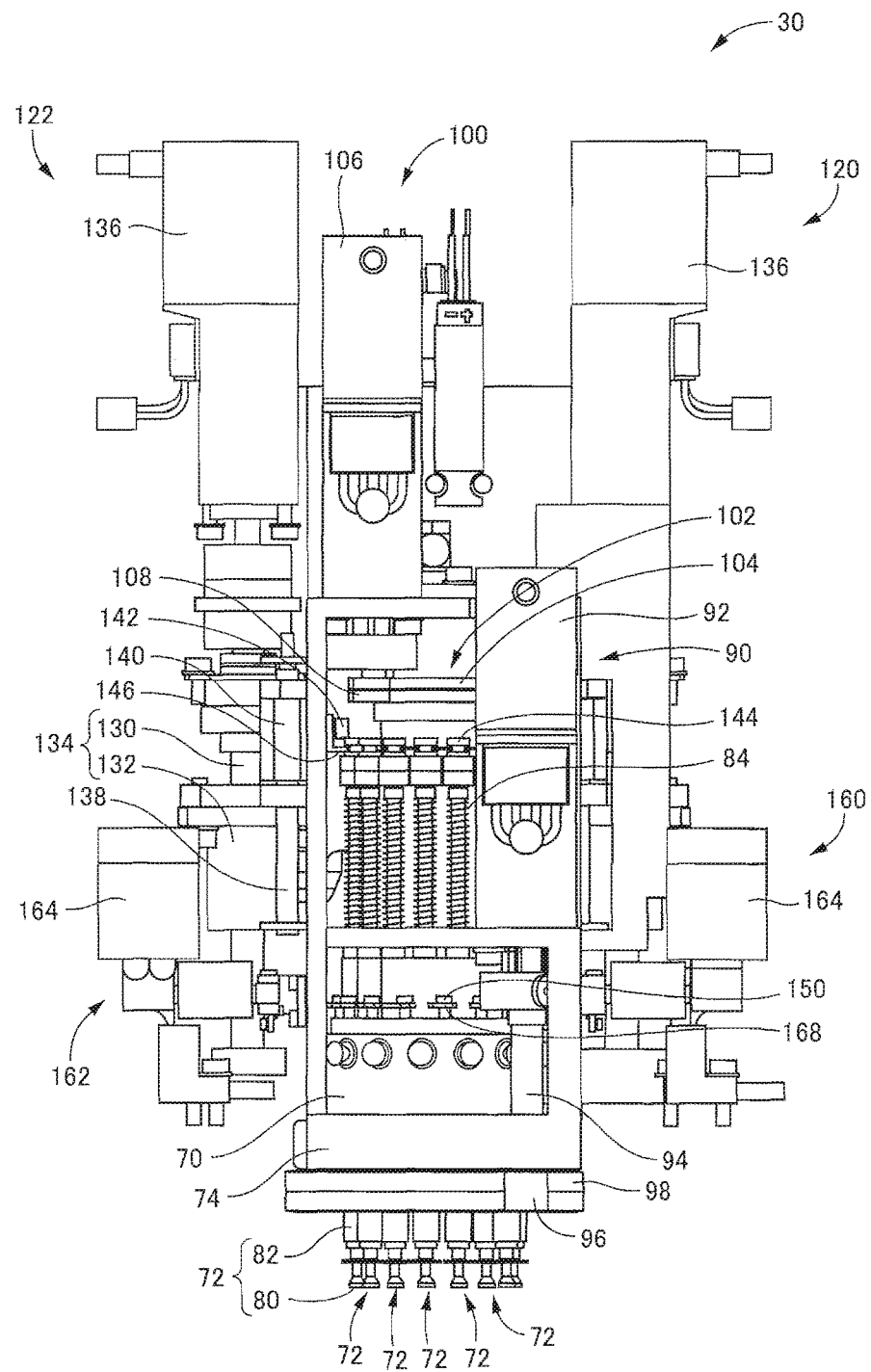

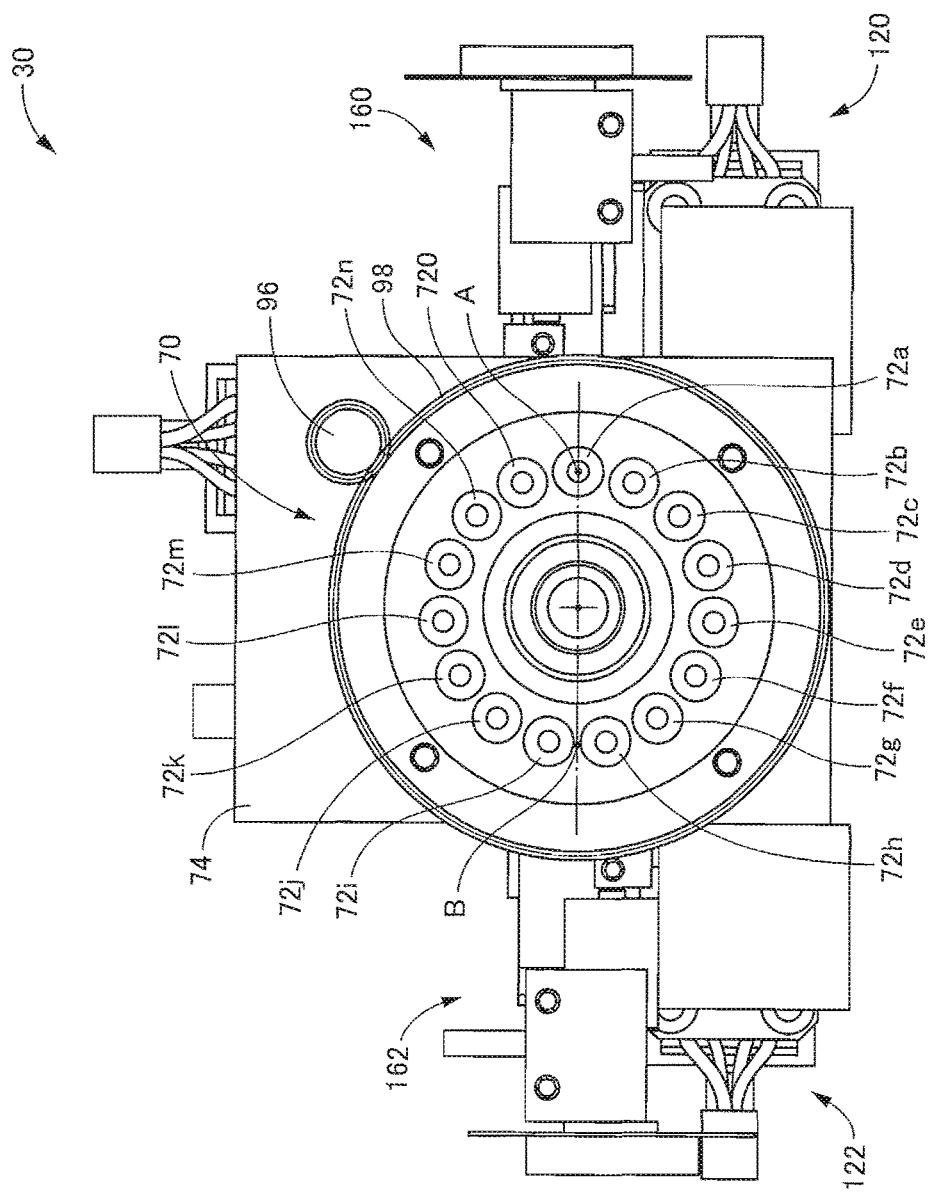
[FIG. 6]

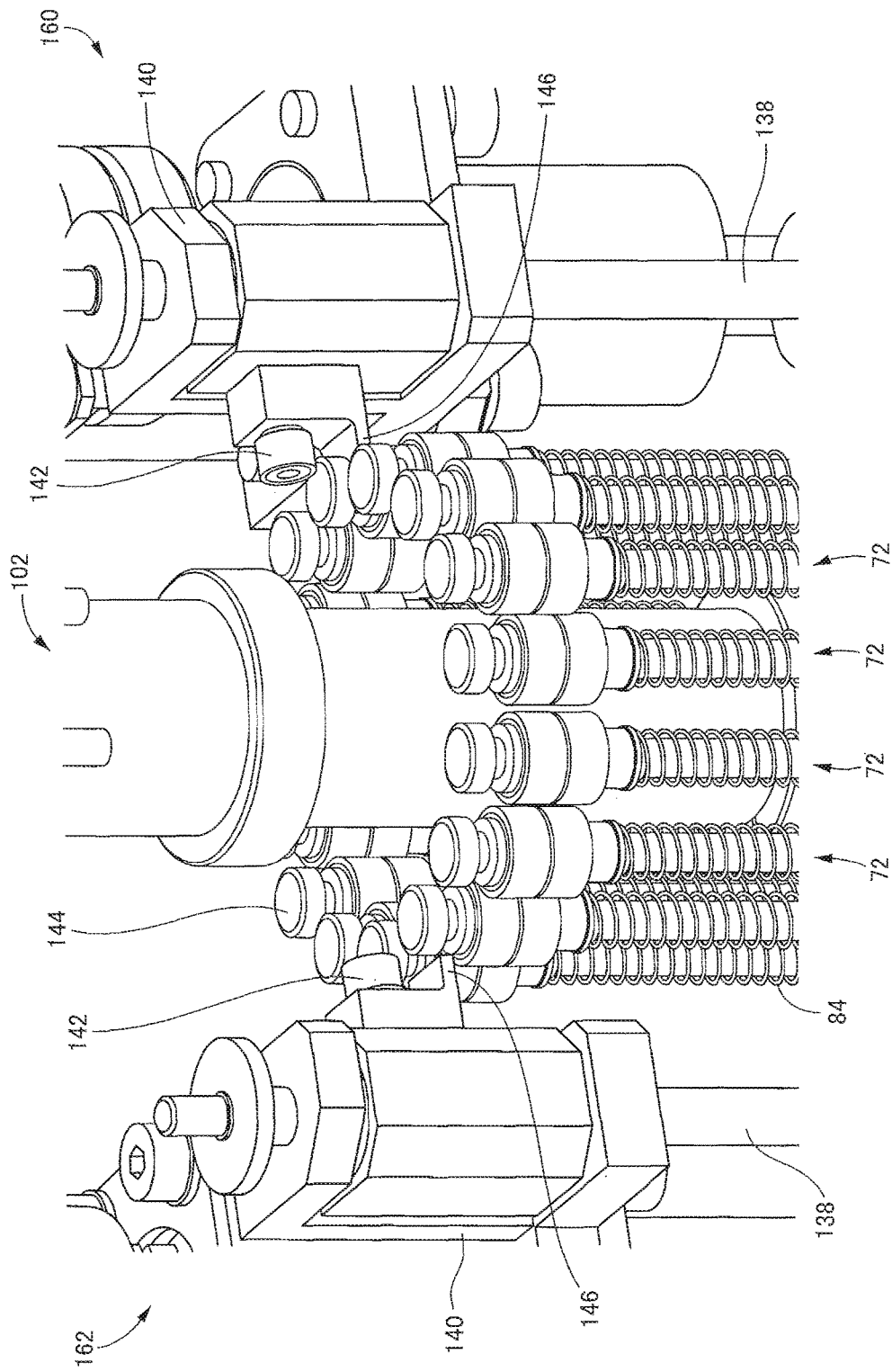
[FIG. 7]

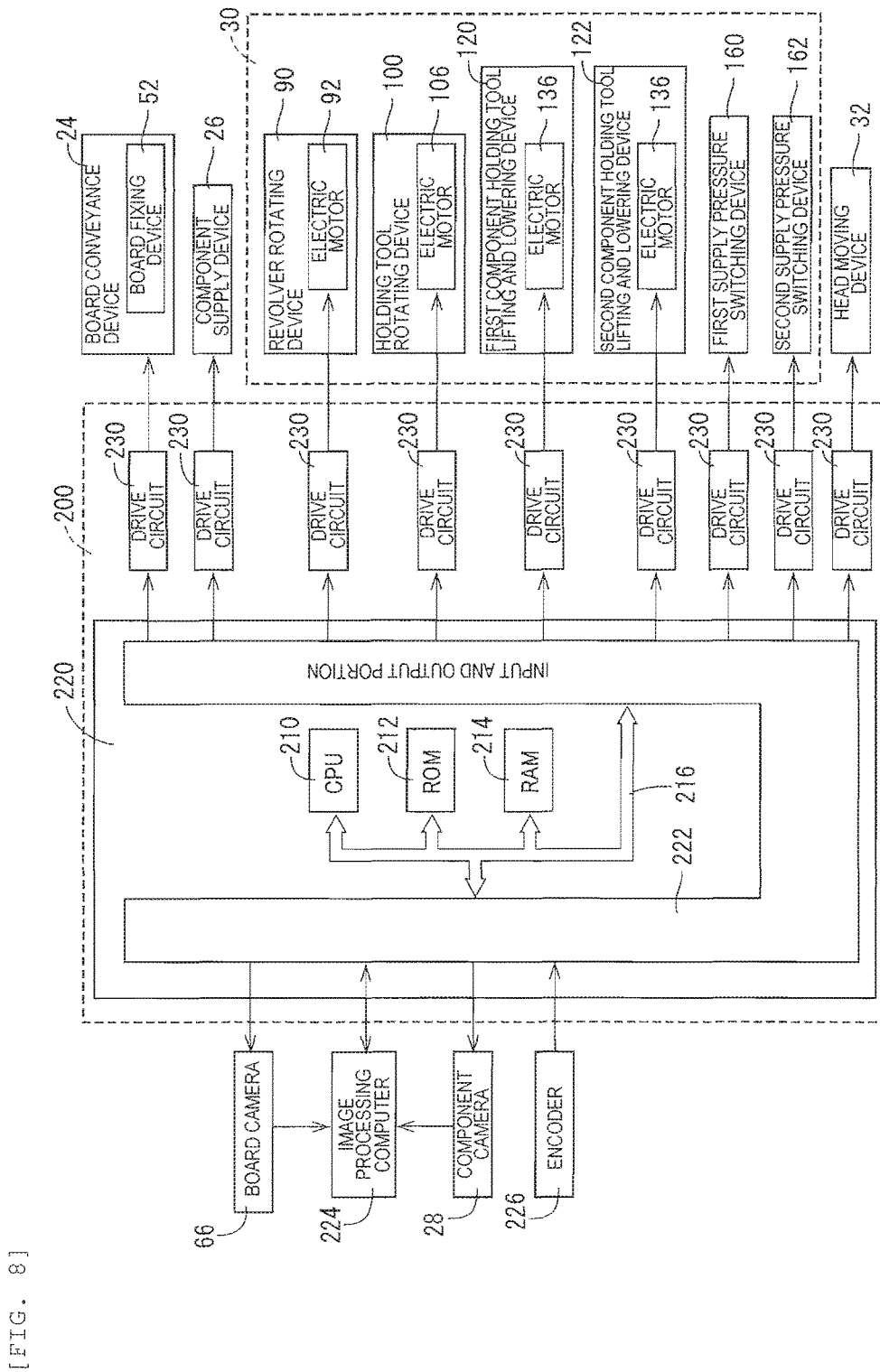
[FIG. 8]

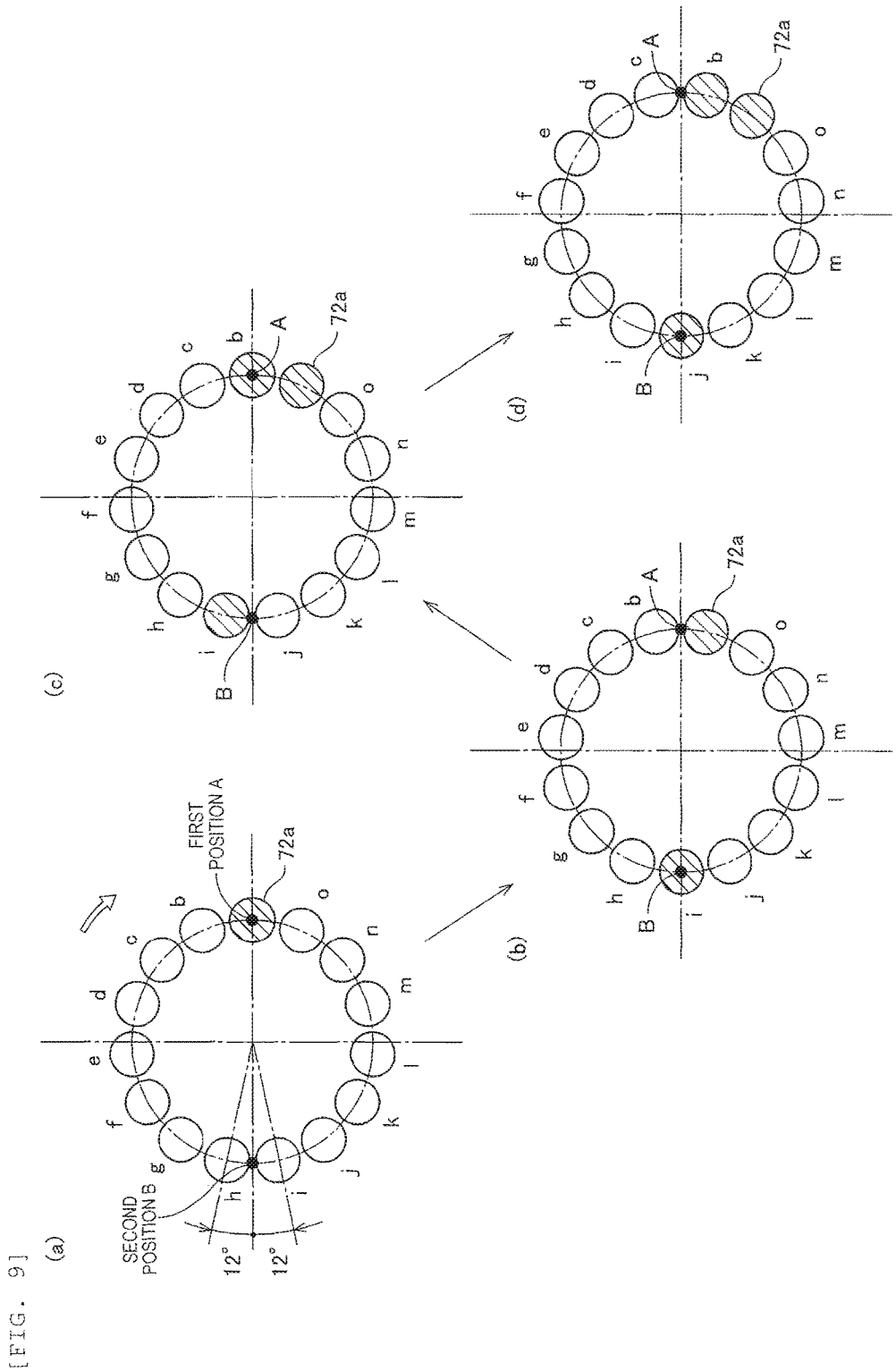
[FIG. 9]

[FIG. 10]
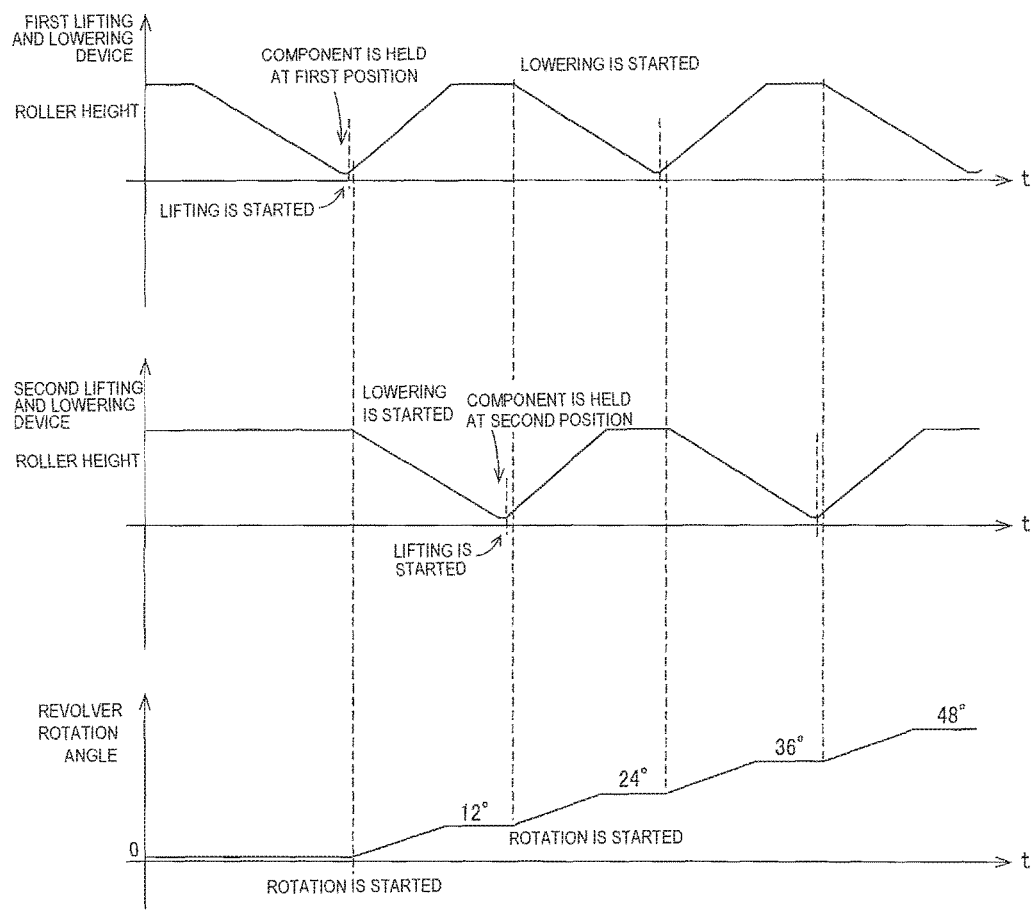

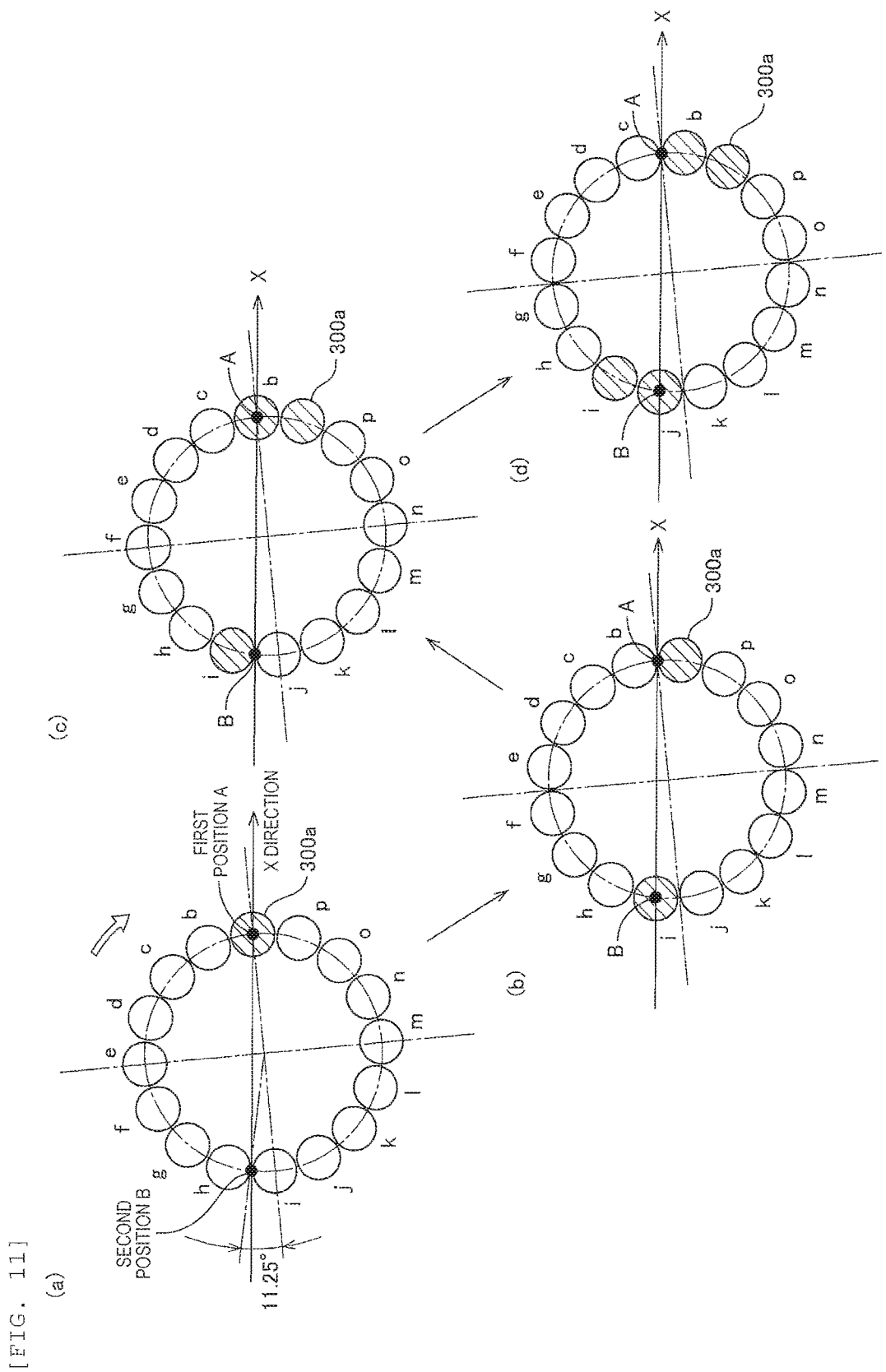

COMPONENT MOUNTING MACHINE

TECHNICAL FIELD

The present disclosure relates to a component mounting machine which receives a component from a component supply device and mounts the component on a printed circuit board.

BACKGROUND ART

In the following PTL 1, a component mounting machine including (A) a component mounting head which has (a) a rotating body which can rotate around a rotation shaft line, (b) a plurality of component holding tools which are installed at an equivalent angle pitch on one circumference around the rotation shaft line, and which respectively hold a component, in the rotating body, and (c) a rotating body rotating device which rotates the rotating body which rotates the plurality of component holding tools along the circumference, around the rotation shaft line, and (B) a component holding tool operating device which is operated for making one of the plurality of component holding tools hold and disengage the component, is described.

CITATION LIST

Patent Literature

PTL 1: Japanese Patent No. 4420970

SUMMARY

Problem to be Solved

In mounting the component as described above, that is, in the so-called component mounting machine provided with a rotary head, in order to improve throughput, various reviews and improvements are performed. For example, in the above-described component mounting machine, the component holding tool operating device includes a component holding tool lifting and lowering device which moves one of the plurality of component holding tools in a vertical direction. In addition, by controlling the component holding tool lifting and lowering device, with respect to a component holding tool which is positioned at the next component supply position or at a component mounting position by the rotation of a rotating body among the plurality of component holding tools, at a stage where the component holding tool approaches the position, the component holding tool starts to be lowered, and the component holding tool holds and disengages the component. After this, the component holding tool is lifted while the rotating body is rotated. In the component mounting machine configured in this manner, as a method of further improving throughput, improving a lifting and lowering speed of the component holding tool by the component holding tool lifting and lowering device, or the rotating speed of the rotating body, is considered. However, from the viewpoint of protecting the component or the printed circuit board, it is difficult to increase the speed. In consideration of such a situation, the present disclosure is to provide a component mounting machine which has high practicality in which processing performance (throughput) per unit time is improved.

Solution to Problem

In order to solve the above-described problem, the component mounting machine of the present disclosure includes: a first holding tool operating device which operates one component holding tool which is positioned at a first position set on one circumference among a plurality of component holding tools for holding and disengaging a component; and a second holding tool operating device which operates one component holding tool which is positioned at a second position set on the circumference among the plurality of component holding tools for holding and disengaging a component, in which, the first position and the second position are set so that the second position is positioned in the middle of any two adjacent component holding tools among the plurality of component holding tools when one of the plurality of component holding tools is positioned at the first position.

Advantageous Effects

In the component mounting machine of the present disclosure, while rotating the rotating body by a half of an alignment pitch angle of the plurality of component holding tools, the first and the second component holding tool operating devices can alternately operate the component holding tool which is positioned at the first position among the plurality of component holding tools, and the component holing tool which is at the second position among the plurality of component holding tools. Therefore, according to the component mounting machine of the present disclosure, due to the rotation by a half of the alignment pitch angle of the component holding tool, one component can be received, or can be mounted on the printed circuit board. Accordingly, compared to a case where the rotating body rotates by the alignment pitch angle, throughput can be improved.

ASPECTS OF DISCLOSURE

Hereinafter, aspects of the disclosure (hereinafter, there is a case where the disclosure is referred to as "claimable disclosure") which can be realized by the patent claims and are considered possible in the specification will be described by several examples. Each aspect is described by dividing clauses, by giving numbers to each clause, and by quoting the number of other clauses as necessary, similar to the claims. This is merely for making it easy to understand the claimable disclosure.

(1) A component mounting machine including: a board fixing device which fixes a printed circuit board; a component supply device which supplies a component at a plurality of supply positions; a component mounting head which includes (a) a rotating body which is rotatable around a rotation shaft line, (b) a plurality of component holding tools which are installed at an equivalent angle pitch on one circumference around the rotation shaft line, and which respectively hold a component, in the rotating body, and (c) a rotating body rotating device which rotates the rotating body which rotates the plurality of component holding tools along the circumference around the rotation shaft line; a first component holding tool operating device which operates one component holding tool which is positioned at a first position set on the circumference among the plurality of component holding tools for holding and disengaging the component, and a second holding tool operating device which operates one component holding tool which is positioned at a second position set on the circumference among the plurality of component holding tools for holding and disengaging the component; and a head moving device which moves the component mounting head for receiving the component by the plurality of component holding tools from the component supply device, and for mounting the component held by the component holding tools onto the printed circuit board fixed by the board fixing device, in which the component supplied by the component supply device is mounted on the printed circuit board fixed by the board fixing device, and in which the first position and the second position are set so that the second position is positioned in the middle of any two adjacent component holding tools among the plurality of component holding tools when one of the plurality of component holding tools is positioned at the first position.

The component mounting machine described in the clause includes a component mounting head which has a rotary structure, and two component holding tool operating devices which operate a plurality of component holding tools including the head for holding and disengaging the component, and can operate the component holding tool which is positioned at a location among two locations on the circumference on which the plurality of component holding tools are aligned. In addition, the component mounting machine described in the clause has a positional relationship of two locations at which the component holding tools are operated. One of the first position and the second position is positioned being shifted only by a half of the alignment pitch angle from the angle which is an integer multiple angle of the alignment pitch angle of the component holding tool, with respect to the other one of the first position and the second position. In other words, by rotating the rotating body by a half of the alignment pitch angle of the component holding tool, the component mounting machine described in the clause can alternately position the plurality of component holding tools to each of the first position and the second position. Therefore, the component mounting machine described in the clause can alternately operate two component holding tool operating devices, and can hold and disengage each component of the plurality of component holding tools.

According to the aspect described in the clause, due to the rotation by a half of the alignment pitch angle of the component holding tool, one component is received, or the component can be mounted on the printed circuit board. Accordingly, compared to a case of the rotation by the alignment pitch angle, throughput can be improved. In addition, as the component mounting machine which is provided with two component holding tool operating devices, for example, a component mounting machine which can operate two component holding tool operating devices at the same time, is considered. However, there is a large restriction that it is necessary to improve accuracy of the supply position of the two components in order to receive the two components at the same time by the component mounting machine having such a configuration. This causes a difficulty in mounting two components at the same time. Meanwhile, the component mounting machine described in the clause reliably receives and mounts the component one by one on each of the plurality of component holding tools, and can improve throughput as described above.

The positional relationship of the first position and the second position is not particularly limited. However, from the viewpoint of receiving the component or suppressing a rotation amount of the rotating body during the mounting, it is desirable that the first position and the second position are positioned to be slightly opposite to each other nipping the rotation shaft line.

(2) The component mounting machine according to clause (1), in which, while the rotating body rotating device rotates the rotating body by a half of the alignment pitch angle of the plurality of component holding tools, the first and the second component holding tool operating devices can alternately operate the component holding tool which is positioned at the first position among the plurality of component holding tools, and the component holing tool which is at the second position among the plurality of component holding tools.

The component mounting machine described in the clause includes a control device which controls the component mounting machine, and the control device can control the rotating body rotating device and two component holding tool operating devices to perform the above-described operation.

(3) The component mounting machine according to clause (1) or (2), in which the number of the plurality of component holding tools provided in the component mounting head is an odd number.

The aspect described in the clause is an aspect in which the number of the plurality of component holding tools is limited to an odd number. In the aspect described in the clause, each of the plurality of component holding tools is positioned in the middle of two adjacent component holding tools among the plurality of component holding tools, to be opposite to each other nipping the rotation shaft line. In other words, in the aspect described in the clause, it is possible to set the first position and the second position to be opposite to each other by 180° nipping the rotation shaft line.

(4) The component mounting machine according to clause (3), in which the first position and the second position are set so as to be positioned to be opposite to each other around the rotation shaft line.

The aspect described in the clause is an aspect in which the first position and the second position are limited to be set to be opposite to each other by 180° nipping the rotation shaft line, as described above. According to the aspect described in the clause, for example, it is possible to dispose the first and the second component holding tool operating devices symmetrically around the rotation shaft line on the component mounting head, and to make the configuration of the component mounting head relatively simple.

(5) The component mounting machine according to any one of clauses (1) to (4), in which the plurality of supply positions are provided to be aligned on one straight line, and in which the first position and the second position are set so that a straight line that links the first position and the second position to each other, is parallel to the straight line on which the plurality of supply positions are aligned.

The aspect described in the clause, the plurality of supply positions, the first position, and the second position can be aligned on the straight line. Therefore, according to the aspect described in the clause, when receiving the component at both the first position and the second position, in a case where the plural types of components are received from the plurality of supply positions by each of the plurality of component holding tools, a direction of moving the component mounting head can be set to be only one direction.

(6) The component mounting machine according to clause (5), in which the plurality of supply positions are provided at an equivalent pitch on the straight line, and in which the first position and the second position are set so that the distance between the first position and the second position is equivalent to an integer multiple value of the pitch of the plurality of supply positions.

The aspect described in the clause is an aspect in which the relationship between the plurality of supply positions, the first position, and the second position is further limited in the aspect in which the plurality of supply positions, the first position, and the second position can be aligned on the straight line. In the aspect described in the clause, both the first position and the second position can be positioned at the supply position. Therefore, according to the aspect described in the clause, without moving the component mounting head, it is possible to receive the component by all of the plurality of component holding tools.

(7) The component mounting machine according to clause (6), in which, when receiving the component by the plurality of component holding tools, the head moving device does not move the component mounting head, and each of the first and the second component holding tool operating devices makes each of the plurality of component holding tools operated by the corresponding component holding tool operating device receive the component from the same position among the plurality of supply positions.

In the aspect described in the cause, the component holding tool which is operated by the first component holding tool operating device consecutively receives the component from one location among the plurality of supply positions, and the component holding tool which is operated by the second component holding tool operating device consecutively receives the component from another location among the plurality of supply positions. In other words, in the aspect described in the clause, it is possible to receive the same component by a half of the plurality of component holding tools, and to receive the same component by all of the holding tools by supplying the same component from two locations. In the aspect in the clause, it is possible to efficiently use a configuration in which the components are alternately received at the first position and the second position, and to remarkably shorten the time for receiving the components by all of the plurality of component holding tools.

(8) The component mounting machine according to any one of clauses (1) to (7), in which each of the first and the second component holding tool operating devices includes a component holding tool lifting and lowering device which moves one of the plurality of component holding tools in a vertical direction, in which the first component holding tool operating device can start to lower the component holding tool at a stage where the component holding tool approaches the first position with respect to the component holding tool which is positioned at the first position next by the rotation of the rotating body around the rotation shaft line among the plurality of component holding tools, and can continue to lift the component holding tool even when the component holding tool is separated from the first position after the component holding tool holds and disengages the component, and in which the second component holding tool operating device can start to lower the component holding tool at a stage where the component holding tool approaches the second position with respect to the component holding tool which is positioned at the second position next by the rotation of the rotating body around the rotation shaft line among the plurality of component holding tools, and can continue to lift the component holding tool even when the component holding tool is separated from the first position after the component holding tool holds and disengages the component.

The aspect described in the clause is, first, limited to a configuration of the component holding tool operating device, in a state where the component holding tool is lowered, the component is held or disengaged. In addition, in the aspect described in the clause, each of the first component holding tool operating device and the second component holding tool operating device can lower and lift the component holding tool according to the rotation of the rotating body.

(9) The component mounting machine according to clause (8), in which, after the first component holding tool operating device receives the component by lowering the component holding tool which is at the first position among the plurality of component holding tools, before ending the lifting of the component holding tool, the rotating body rotating device starts to rotate the rotating body, and the second component holding tool operating device starts to lower the component holding tool which approaches the second position among the plurality of component holding tools.

In the aspect described in the clause, according to the rotation of the rotating body, one of two component holding tool operating devices lifts the component holding tool which corresponds to the component holding tool operating device, and the other one of two component holding tool operating devices lowers the component holding tool which corresponds to the component holding tool operating device. In the aspect described in the clause, since three operations, that is, the rotation of the rotating body, the lifting of one component holding tool, and the lowering of one more component holding tool, are performed at the same time, it is possible to largely improve throughput.

(10) The component mounting machine according to anyone of clauses (1) to (9), in which, when mounting the component received by each of the plurality of component holding tools onto the printed circuit board, in a case where the first position is close to the next mounting position on the printed circuit board, the first component holding tool operating device is used, and in a case where the second position is close to the next mounting position, the second component holding tool operating device is used.

The aspect described in the clause is an aspect in which a mounting method of the component received by the plurality of component holding tools on the printed circuit board is limited. In the aspect described in the clause, for example, in a case where the component mounting head is at a position for mounting a certain component, by comparing the distance between the first position and the next mounting position and the distance between the second position and the next mounting position at this time, the head moving device can move the component mounting head so that the first position or the second position which corresponds to a shorter distance matches the next component mounting position. Therefore, according to the aspect of the clause, it is possible to improve throughput by reducing the movement of the component mounting head.

(11) The component mounting machine according to any one of clauses (1) to (10), in which, when mounting the component received by each of the plurality of component holding tools onto the printed circuit board, only one of the first and the second component holding tool operating devices is used.

The aspect described in the clause is an aspect in which a mounting method of the component received by the plurality of component holding tools on the printed circuit board is limited. In the aspect described in the clause, the rotating body is rotated intermittently by the alignment pitch angle of the component holding tool, and the components are consecutively mounted only by any of two component holding tool operating devices. The aspect described in the clause is efficient, for example, in a case where the mounting positions of the plurality of components are close to each other.

BRIEF DESCRIPTION OF DRAWINGS

FIG. 1 is a perspective view of a component mounting machine which is a first embodiment of the present disclosure.

FIG. 2 is a perspective view which enlarges and illustrates a component conveyance device illustrated in FIG. 1.

FIG. 3 is a perspective view which enlarges and illustrates a head moving device illustrated in FIG. 1.

FIG. 4 is a perspective view illustrating an inside of a component mounting head illustrated in FIG. 1.

FIG. 5 is a front view illustrating the inside of the component mounting head illustrated in FIG. 1.

FIG. 6 is a view illustrating the component mounting head illustrated in FIG. 1 from below.

FIG. 7 is a view which enlarges and illustrates a location at which a component holding tool illustrated in FIG. 1 is operated by a component holding tool lifting and lowering device.

FIG. 8 is a block diagram schematically illustrating a control device which controls the component mounting machine according to the first embodiment.

FIG. 9 is a schematic view illustrating an operation when holding and disengaging a component by the component mounting head in the component mounting machine of the first embodiment.

FIG. 10 is a time chart illustrating operations of two component holding tool lifting and lowering devices and a revolver rotating device when holding and disengaging the component by the component mounting head in the component mounting machine of the first embodiment.

FIG. 11 is a schematic view illustrating an operation of holding and disengaging the component by a component mounting head in a component mounting machine of a second embodiment.

DESCRIPTION OF EMBODIMENTS

Hereinafter, embodiments which are aspects for realizing the claimable disclosure will be described in detail with reference to the drawings.

First Embodiment

Configuration of Component Mounting Machine

A component mounting machine 10 which is a first embodiment of the claimable disclosure is illustrated in a perspective view of FIG. 1. In addition, in work of mounting a component on a printed circuit board, a plurality of component mounting machines 10 are disposed in order to mount a plural types of components on the printed circuit board. FIG. 1 illustrates two of the plurality of component mounting machines 10, and illustrates that one of the two component mounting machines 10 is in a state where an exterior panel is removed. The component mounting machine 10 includes a base 20, a beam 22 which is installed to be fixed to the base 20, a board conveyance device 24 which is installed on the base, a component supply device 26 which is attached to the base 20 on a front surface side of the component mounting machine 10, a component camera 28 which is fixed to the base 20 between the board conveyance device 24 and the component supply device 26, a component mounting head 30 which is disengaged for holding the component supplied from the component supply device 26 and mounting the component onto a printed circuit board S, and a head moving device 32 which is installed in the beam 22 and moves the component mounting head 30. In addition, in the following description, a direction in which a base material is conveyed by the board conveyance device 24 is referred to as a horizontal direction (X direction), a direction which is perpendicular to the horizontal direction on a horizontal plane is referred to as a longitudinal direction (Y direction), and a direction which is perpendicular to the horizontal direction and the longitudinal direction is referred to as a vertical direction (Z direction).

FIG. 2 illustrates a perspective view of the board conveyance device 24. FIGS. 2A and 2B are perspective views from the directions opposite to each other. The board conveyance device 24 includes one pair of conveyors 40, and by circulating each of conveyor belts 42 of one pair of conveyors 40 by a conveyance motor 44, the board conveyance device 24 conveys the printed circuit board S loaded on one pair of conveyor belts 42 in the horizontal direction. In addition, although not illustrated in the detailed description, one of the pair of conveyors 40 is moved in the longitudinal direction by an electric motor 46, and can correspond to the printed circuit board S having various widths. In addition, the board conveyance device 24 can nip and fix the printed circuit board S between a support table 48 and a flange portion 50 provided above each of one pair of conveyors 40 by lifting the support table 48. In other words, the board conveyance device 24 includes a board fixing device 52 which has the support table 48 and the flange portion 50.

The component supply device 26 includes a plurality of component feeders 56. Each of the plurality of component feeders 56 is attached to the base 20 being aligned in the X-axis direction. In each of the plurality of component feeders 56, a reel around which the component of a component holding tape (the plurality of components are held by the tape, and the tape is also called a "component taping") is set. Each of the plurality of the component feeders 56 consecutively supplies the components one by one by intermittently sending out the component holding tape, at a predetermined component supply position. In other words, the component supply device 26 supplies the components at the plurality of supply positions.

In addition, each of the plurality of component feeders 56 is positioned and fixed to the base 20 in the X-axis direction and in the Y-axis direction. In addition, in a state where each of the plurality of component feeders 56 is fixed onto the base 20, each of the supply positions is aligned on one straight line in the X-axis direction at an equivalent pitch.

FIG. 3 illustrates a perspective view of the head moving device 32. The head moving device 32 is a so-called XY type moving device, and includes an X-direction moving mechanism 60 which moves the component mounting head 30 in the X direction, and a Y-direction moving mechanism 62 which moves the component mounting head 30 in the Y direction. Specifically, the Y-direction moving mechanism 62 is supported by the beam 22, and moves the X-direction moving mechanism 60 across the component supply device 26 and the printed circuit board S. The X-direction moving mechanism 60 supports a head attaching body 64 to which the component mounting head 30 is attached to be attachable and detachable, and moves the head attaching body 64 in the X direction. In addition, as illustrated in FIG. 3, a board camera 66 for imaging a front surface of the printed circuit board S is fixed to a lower portion of the head attaching body 64.

Next, the component mounting head 30 will be described in detail with reference to FIGS. 4 to 6. FIGS. 4 to 6 are views illustrating a state where a cover of the component mounting head 30 is removed, and respectively, FIG. 4 illustrates a perspective view, FIG. 5 illustrates a front view, and FIG. 6 illustrates a view seen from below. The component mounting head 30 is a rotary head, and includes a revolver 70 which functions as a rotating body that is rotated around the rotation shaft line, and a plurality of component holding tools 72 held by the revolver 70.

The revolver 70 is supported to be rotatable via a bearing which is not illustrated, by a supporting portion 74 which becomes a base of the component mounting head 30. A cross-sectional shape of the revolver 70 is a ring shape, and the revolver 70 is rotated by using the center thereof as the rotation shaft line. Each of the plurality of component holding tools 72 includes a component suction nozzle 80 and a nozzle holding shaft 82 which extends parallel to the rotation shaft line and holds the component suction nozzle 80 at a lower end thereof. As the plurality of nozzle holding shafts 82 are held by the revolver 70, the plurality of component holding tools 72 are held by the revolver 70. In addition, as illustrated in FIG. 6, each of the plurality of component holding tools 72 is installed on a circumference around the rotation shaft line at an equivalent angle pitch. More specifically, in the present embodiment, 15 component holding tools 72 are provided and installed at a pitch of 24°. Therefore, as the revolver 70 rotates around the rotation shaft line, 15 component holding tools 72 are rotated along a circumference.

Each of 15 component holding tools 72 is held to be movable in the direction parallel to the rotation shaft line from the revolver 70, that is, in the vertical direction in a state of being extended in the vertical direction. In addition, each of the component holding tools 72 is biased upward by a compression spring 84 which is installed between an upper end of the component holding tool 72 and an upper surface of the revolver 70, and is generally at a lifted position.

The component mounting head 30 includes a revolver rotating device 90 which functions as a rotating body rotating device that rotates the revolver 70 around the rotation shaft line. The revolver rotating device 90 includes an electric motor 92 which is fixed to the supporting portion 74, and a driving gear 96 which is fixed to an output shaft 94 that protrudes to a lower part of the electric motor 92. The driving gear 96 meshes with a gear 98 which is formed on an outer circumferential surface of the revolver 70. Therefore, by the electric motor 92, the driving gear 96 is rotated, and the revolver 70 is rotated. In addition, the electric motor 92 is an encoder-attached motor, and can control a rotation angle.

The component mounting head 30 includes a holding tool rotating device 100 which rotates 15 component holding tools 72 around each shaft line. The holding tool rotating device 100 is omitted from the detailed description, but rotates each of all of 15 component holding tools around the shaft line simultaneously. Although not illustrated in the drawing, the gears are formed in each of the component holding tools 72, and mesh with the gears which are formed on a lower end side of a rotation shaft 102 that is rotatable around the shaft line installed coaxially to the revolver 70. A gear 104 is formed on an upper end side of the rotation shaft 102. The holding tool rotating device 100 mainly includes an electric motor 106 which is fixed to the supporting portion 74, and a driving gear 108 which is rotated by the electric motor 106, and the driving gear 108 meshes with the gear 104 of the rotation shaft 102. Therefore, the rotation shaft 102 is rotated as the driving gear 108 is rotated by the electric motor 106, and each of the component holding tools 72 is simultaneously rotated by the same angle in the same direction around the shaft line thereof.

The component mounting head 30 includes two component holding tool lifting and lowering devices which lift and lower one of 15 component holding tools 72 for holding and disengaging the component. One of the two component holding tool lifting and lowering devices is a first component holding tool lifting and lowering device 120 (hereinafter, there is a case where the device is simply called "first lifting and lowering device 120") which lifts and lowers one component holding tool 72 that is positioned at a first position A set on the circumference among 15 component holding tools 72, and which functions as a first component holding tool operating device. In addition, one of the two component holding tool lifting and lowering devices is a second component holding tool lifting and lowering device 122 (hereinafter, there is a case where the device is simply called "second lifting and lowering device 122") which lifts and lowers one component holding tool 72 that is positioned at a second position B set on the circumference among 15 component holding tools 72, and which functions as a second component holding tool operating device.

As illustrated in FIG. 6, the first position A and the second position B are set to be positioned to be opposite to each other nipping the rotation shaft line of the revolver 70. More specifically, the first position A and the second position B are set so that the first position A, the second position B, and the rotation shaft line are aligned on one straight line which extends in the X direction. In other words, when one (component holding tool 72a in FIG. 6) of 15 component holding tools 72 is positioned at the first position A, the center of two adjacent component holding tools 72 (component holding tools 72h and 72i in FIG. 6) among 15 component holding tools 72 is positioned at the second position B.

Since the first lifting and lowering device 120 and the second lifting and lowering device 122 have the same configuration, the same reference numerals are given to the same configuration elements. The first lifting and lowering device 120 and the second lifting and lowering device 122 mainly include a screw mechanism 134 which has a screw shaft 130 and a nut 132, and an electric motor 136 which is fixed to the supporting portion 74 and rotates the screw shaft 130. A slider 140 which is guided in the vertical direction by a guide lot 138 is fixed to the nut 132. In other words, by the rotation of the screw shaft 130 due to the electric motor 136, both the nut 132 and the slider 140 are moved in the vertical direction.

As enlarged and illustrated in FIG. 7, a roller 142 is attached to the slider 140. The roller 142 is positioned above the plurality of component holding tools 72. In addition, the roller 142 is attached to be rotatable around the shaft line which extends in a radial direction of a circle in which the plurality of component holding tools 72 are installed. Meanwhile, at each of the upper ends of the plurality of component holding tools 72, an engaging portion 144 with which the roller 142 engages is provided. As the slider 140 is lowered by the electric motor 136, in a state where the roller 142 is in contact with an upper surface of the engaging portion 144 of the component holding tool 72 which is positioned at the first position A or at the second position B, the component holding tool 72 is lowered against a biasing force of the compression spring 84.

In addition, in the slider 140, a flange portion 146 which extends in the same direction as that of the roller 142 is provided below the roller 142. The flange portion 146 goes into the lower side of the engaging portion 144 of the component holding tool 72 which is positioned at the first position A or at the second position B. In addition, the lowered component holding tool 72 is basically lifted by the biasing force of the compression spring 84, but as the slider 140 is lifted by the electric motor 136, the flange portion 146 assists the lifting of the component holding tool 72 in a state of being in contact with the lower surface side of the engaging portion 144 of the component holding tool 72.

In addition, each of 15 component holding tools 72 absorbs and holds the electronic circuit component by negative pressure. Inside the nozzle holding shaft 82 of each of the component holding tools 72, a path which is not illustrated is formed, and positive pressure and negative pressure are selectively supplied. In the revolver 70, 15 spool type valves are provided corresponding to each of 15 component holding tools 72. In addition, valve spools 150 included in each of 15 valves protrude upward from the revolver 70. The 15 valves supply positive pressure during the normal time, and the pressure is switched to negative pressure by pushing down the valve spool 150.

The component mounting head 30 includes two supply pressure switching devices for switching the positive pressure and the negative pressure to each other by pushing down the valve spool 150. A first supply pressure switching device 160 switches the positive pressure and the negative pressure of the valve which corresponds to the component holding tool 72 that is at the first position A, and a second supply pressure switching device 162 switches the positive pressure and the negative pressure of the valve which corresponds to the component holding tool 72 that is at the second position B.

The supply pressure switching devices 160 and 162 include an electric motor 164 and two levers 166 which are rotated by the electric motor 164. Meanwhile, in the valve spool 150, a flange 168 which protrudes toward the outer side in the radial direction is provided. When the component holding tool 72 is positioned at the first position A or at the second position B, the flange 168 of the valve spool 150 which corresponds to the component holding tool 72 goes into between two levers 166 provided in the supply pressure switching devices 160 and 162. In addition, by rotating two levers 166 by the electric motor 164, by pushing down the valve spool 150, and by rotating two levers 166 in an opposite direction, the valve spool 150 is pushed up.

The component mounting machine 10 of the present embodiment is provided with a control device 200 which controls the component mounting machine 10. As illustrated in FIG. 8, the control device 200 mainly includes a control computer 220 which has a CPU 210, a ROM 212, a RAM 214, and a bus 216 that connects the CPU 210, the ROM 212, and the RAM 214. An image processing computer 224 which processes image data obtained by respectively imaging the board camera 66 and the component camera 28, and an encoder 226 (one of a plurality of encoders is representatively illustrated) of an encoder-attached servo motor, are connected to an input and output portion 222. Various actuators, such as the electric motor 92 of the revolver rotating device 90 or the electric motor 136 of the component holding tool lifting and lowering devices 120 and 122, are connected to the input and output portion 222 via a drive circuit 230. In the ROM 212, various pieces of programs and data are stored. The control device 200 controls various actuators connected as described above, and performs component mounting operation by the component mounting machine 10 as will be described hereinafter.

Outline of Component Mounting Operation by Component Mounting Machine

Simply describing the component mounting operation by the component mounting machine 10 of the present embodiment, first, the printed circuit board S supplied to the work is conveyed to an upstream side by the board conveyance device 24, and is fixed at a predetermined work position. Next, the board camera 66 is operated by the head moving device 32, and a fiducial mark attached to an upper surface of the printed circuit board S is imaged. Based on the imaging data obtained by the imaging, a coordinate system which becomes a reference of a mounting position is determined. In addition, a mounting order is determined from the plurality of mounting positions.

Next, the component mounting head 30 is positioned above the component supply device 26 by the head moving device 32, and the components are consecutively held in each of 15 component holding tools 72. In addition, receiving work of the component will be described in detail later. Next, when the component mounting head 30 is moved to an upper part of the printed circuit board S, the components which pass through the upper part of the component camera 28 and are held by each of the component holding tools 72, are imaged by the component camera 28. Based on the imaging data, a positional shift amount (a concept including a rotation position shift) with respect to a nozzle shaft line of each component is ascertained. Next, each component is moved to the component mounting head 30 and onto the printed circuit board S, and is consecutively mounted on the mounting position determined by the mounting program while performing correction based on the positional shift amount. The component mounting head 30 reciprocates between the component supply device 26 and the printed circuit board S for the number of times determined by the mounting program, the components are repeatedly received and mounted by the component mounting head 30, and the component mounting operation is completed by one component mounting machine 10. When one printed circuit board S passes through the plurality of component mounting machines 10, the above-described component mounting work is consecutively performed by each component mounting machine 10 with respect to one printed circuit board S, and the mounting operation with respect to one printed circuit board S is completed by the plurality of component mounting machines 10.

Characteristics of Component Mounting Machine

As described above, the component mounting machine 10 can lift and lower the component holding tool 72 at two locations, that is, the first position A and the second position B. In addition, in the component mounting machine 10, by the above-described configuration, as the revolver rotating device 90 rotates the revolver 70 by a half (12°, hereinafter, there is a case where the half angle is called a half pitch) of an alignment pitch angle (24°) of 15 component holding tools 72, 15 component holding tools 72 are positioned at the first position A and at the second position B. Therefore, in the component mounting machine 10, as illustrated in FIG. 9, the revolver rotating device 90 rotates the revolver 70 by a half pitch, and two component holding tool lifting and lowering devices 120 and 122 can alternately lift and lower the component holding tool 72 which is positioned at the first position A and the component holding tool 72 which is at the second position B among 15 component holding tools 72. In other words, FIG. 9 illustrates the positions of 15 component holding tools 72, the first position A, and the second position B, from above of the component mounting machine 10.

As described above, the first position A and the second position B are disposed being aligned in the X direction. In addition, as described above, the plurality of supply positions of the component supply devices 26 are disposed being aligned on one straight line in the X direction. Therefore, when receiving the component from the component supply device 26, in principle, the component mounting head 30 may be moved only in the X direction by the head moving device 32. In addition, in the component mounting machine 10, the component at the supply position on a right end side can be received from the first position A, and the component at the supply position on a left end side can be received from the second position B. Therefore, according to the component mounting machine 10, compared to a component mounting machine which receives a component at one location, it is possible to shorten the moving distance of the component mounting head 30, and to improve throughput.

In addition, as described above, the plurality of supply positions are installed being aligned at an equivalent pitch in the X direction. In the component mounting machine 10, the distance between the first position A and the second position B is an integer multiple value of the pitch of the supply position. In other words, the component mounting machine 10 can position the first position A and the second position B at the supply position at the same time. Therefore, in the component mounting machine 10, the head moving device 32 does not move the component mounting head 30, and each of two component holding tool lifting and lowering devices 120 and 122 can receive the components from the same supply position by each of the component holding tools 72 lifted and lowered by two component holding tool lifting and lowering devices 120 and 122.

In a case described above, the component mounting machine can be more effectively operated. Specifically, as illustrated in a time chart in FIG. 10, the first component holding tool lifting and lowering device 120 starts to lift the component holding tool 72 after lowering the component holding tool 72 which is at the first position A and receiving the component, the revolver rotating device 90 starts the rotation of the revolver 70, and further, the second component holding tool lifting and lowering device 122 starts to lower the component holding tool 72 which approaches the second position B. In addition, similarly, the second component holding tool lifting and lowering device 122 starts to lift the component holding tool 72 after lowering the component holding tool 72 which is at the second position B and receiving the component, the revolver rotating device 90 starts the rotation of the revolver 70, and further, the first component holding tool lifting and lowering device 120 starts to lower the component holding tool 72 which approaches the first position A. In other words, the component mounting machine 10 can improve throughput by performing three operations at the same time.

Next, the work of mounting the components received by each of the plurality of component holding tools 72 on the printed circuit board S in the component mounting machine 10 will be described. The component mounting machine 10 mounts the component to the next mounting position on the printed circuit board S by using the first component holding tool lifting and lowering device 120 in a case where the first position A is relatively closer compared to the second position, and the head moving device 32 moves the component mounting head 30. Meanwhile, the component mounting machine 10 mounts the component to the next mounting position by using the second component holding tool lifting and lowering device 122 in a case where the second position B is relatively closer compared to the first position A, and the head moving device 32 moves the component mounting head 30. Therefore, according to the component mounting machine 10, it is possible to shorten the moving distance of the component mounting head 30, and to improve throughput.

In addition, in a case where the mounting position of the component is relatively close, the component mounting machine 10 can mount the component onto the printed circuit board S as the revolver rotating device 90 rotates the revolver 70 by an alignment pitch angle, by using only any one of the first component holding tool lifting and lowering device 120 and the second component holding tool lifting and lowering device 122.

Second Embodiment

In the component mounting machine 10 of the above-described first embodiment, the component mounting head 30 includes the odd number (15) of component holding tools 72, but in the component mounting machine of the present embodiment, the component mounting head includes the even number (16) of component holding tools 300. In addition, the component mounting machine of the present embodiment includes two component holding tool lifting and lowering devices, similar to that of the first example. However, the positions of the first position A and the second position B are different from those of the first embodiment. Therefore, the component mounting machine of the present embodiment is configured of substantially similar configuration elements as those of the component mounting machine 10 of the first embodiment. Due to this, in the component mounting machine of the present embodiment, only the positions of 16 component holding tools 300 and the disposition of the first position A and the second position B, will be described.

FIG. 11 is a plan view illustrating the positions of 16 component holding tools 300 and the disposition of the first position A and the second position B in a case of being seen from above of the component mounting machine of the present embodiment. Each of 16 component holding tools 300 is installed at an equivalent angle pitch (22.5°) on the circumference. In addition, the second position B is positioned being shifted by a half pitch (11.25°) from the position which is opposite by 180° of the first position A. In other words, when one of 16 component holding tools 300 (component holding tool 300a in FIG. 11A) is positioned at the first position A, the center of two adjacent component holding tools 300 (component holding tools 300h and 300i in FIG. 11A) among 16 component holding tools 300 is positioned at the second position B. In other words, similar to the component mounting machine 10 of the first embodiment, the component mounting machine of the present embodiment can alternately position each of the plurality of component holding tools 300 at the first position A and at the second position B by rotating the revolver by a half pitch.

In addition, in the component mounting machine of the present embodiment, the revolver is supported by a support portion so that a direction in which the first position A and the second position B are linked to each other becomes the X direction. In other words, the direction in which the first position A and the second position B are linked to each other is parallel to a direction in which a plurality of supply positions of the component supply device 26 are aligned, and the distance between the first position A and the second position B is an integer multiple value of the pitch of the supply position. Therefore, the component mounting machine of the present embodiment can perform receiving work and mounting operation similar to the component mounting machine 10 of the first embodiment.

REFERENCE SIGNS LIST

10: component mounting machine, 24: board conveyance device, 26: component supply device, 30: component mounting head, 32: head moving device, 52: board fixing device, 56: plural component feeders, 70: revolver [rotating body], 72: plurality of component holding tools (15), 80: component suction nozzle, 82: nozzle holding shaft, 90: revolver rotating device [rotating body rotating device], 92: electric motor, 100: holding tool rotating device, 120: first component holding tool lifting and lowering device [first component holding tool operating device], 122: second component holding tool lifting and lowering device [second component holding tool operating device], 136: electric motor, 150: valve spool, 160: first supply pressure switching device, 162: second supply pressure switching device, 164: electric motor, 200: control device, 300: plurality of component holding tools (16)

The invention claimed is:

1. A component mounting machine comprising:
   a board fixing device which fixes a printed circuit board;
   a component supply device which supplies a component at a plurality of supply positions;
   a component mounting head which includes (a) a rotating body which is rotatable around a rotation shaft line, (b) a plurality of component holding tools which are installed at an equivalent angle pitch on one circumference around the rotation shaft line, and which respectively hold a component, in the rotating body, and (c) a rotating body rotating device which rotates the rotating body which rotates the plurality of component holding tools along the circumference around the rotation shaft line;
   a first component holding tool operating device which operates one component holding tool which is positioned at a first position set on the circumference among the plurality of component holding tools for holding and disengaging the component, and a second component holding tool operating device which operates one component holding tool which is positioned at a second position set on the circumference among the plurality of component holding tools for holding and disengaging the component; and
   a head moving device which moves the component mounting head for receiving the component by the plurality of component holding tools from the component supply device, and for mounting the component held by the plurality of component holding tools onto the printed circuit board fixed by the board fixing device,
   wherein the component supplied by the component supply device is mounted on the printed circuit board fixed by the board fixing device,
   wherein the first position and the second position are set so that the second position is positioned in the middle of any two adjacent component holding tools among the plurality of component holding tools when one of the plurality of component holding tools is positioned at the first position, and
   wherein, while the rotating body rotating device rotates the rotating body by a half of the alignment pitch angle of the plurality of component holding tools, the first component holding tool operating device and the second component holding tool operating device alternately operate the component holding tool which is positioned at the first position among the plurality of component holding tools, and the component holding tool which is at the second position among the plurality of component holding tools.

2. The component mounting machine according to claim 1,
   wherein the number of the plurality of component holding tools provided in the component mounting head is an odd number, and
   wherein the first position and the second position are set so as to be positioned to be opposite to each other around the rotation shaft line.

3. The component mounting machine according to claim 1,
   wherein the plurality of supply positions are provided to be aligned on one straight line, and
   wherein the first position and the second position are set so that a straight line that links the first position and the second position to each other, is parallel to the straight line on which the plurality of supply positions are aligned.

4. The component mounting machine according to claim 1,
   wherein each of the first component holding tool operating device and the second component holding tool operating device includes a component holding tool lifting and lowering device which moves one of the plurality of component holding tools in a vertical direction,
   wherein the first component holding tool operating device starts to lower the component holding tool at a stage where the component holding tool approaches the first position with respect to the component holding tool which is positioned at the first position next by the rotation of the rotating body around the rotation shaft line among the plurality of component holding tools, and continues to lift the component holding tool even when the component holding tool is separated from the first position after the component holding tool holds and disengages the component, and
   wherein the second component holding tool operating device starts to lower the component holding tool at a stage where the component holding tool approaches the second position with respect to the component holding tool which is positioned at the second position next by the rotation of the rotating body around the rotation shaft line among the plurality of component holding tools, and continues to lift the component holding tool even when the component holding tool is separated from the first position after the component holding tool holds and disengages the component.

5. The component mounting machine according to claim 4,
   wherein, after the first component holding tool operating device receives the component by lowering the component holding tool which is at the first position among the plurality of component holding tools, before ending the lifting of the component holding tool, the rotating body rotating device starts to rotate the rotating body, and the second component holding tool operating device starts to lower the component holding tool which approaches the second position among the plurality of component holding tools.

6. The component mounting machine according to claim 1
wherein, when mounting the component received by each of the plurality of component holding tools onto the printed circuit board, only one of the first and the second component holding tool operating devices is used.

7. A component mounting machine comprising:
a board fixing device which fixes a printed circuit board;
a component supply device which supplies a component at a plurality of supply positions;
a component mounting head which includes (a) a rotating body which is rotatable around a rotation shaft line, (b) a plurality of component holding tools which are installed at an equivalent angle pitch on one circumference around the rotation shaft line, and which respectively hold a component, in the rotating body, and (c) a rotating body rotating device which rotates the rotating body which rotates the plurality of component holding tools along the circumference around the rotation shaft line;
a first component holding tool operating device which operates one component holding tool which is positioned at a first position set on the circumference among the plurality of component holding tools for holding and disengaging the component, and a second component holding tool operating device which operates one component holding tool which is positioned at a second position set on the circumference among the plurality of component holding tools for holding and disengaging the component; and
a head moving device which moves the component mounting head for receiving the component by the plurality of component holding tools from the component supply device, and for mounting the component held by the plurality of component holding tools onto the printed circuit board fixed by the board fixing device,
wherein the component supplied by the component supply device is mounted on the printed circuit board fixed by the board fixing device,
wherein the first position and the second position are set so that the second position is positioned in the middle between two adjacent component holding tools among the plurality of component holding tools when one of the plurality of component holding tools is positioned at the first position,
wherein the plurality of supply positions are provided to be aligned on one straight line,
wherein the first position and the second position are set so that a straight line that links the first position and the second position to each other, is parallel to the straight line on which the plurality of supply positions are aligned,
wherein the plurality of supply positions are provided at an equivalent pitch on the straight line, and
wherein the first position and the second position are set so that the distance between the first position and the second position is equivalent to an integer multiple value of the pitch of the plurality of supply positions.

8. The component mounting machine according to claim 7,
wherein, when receiving the component by the plurality of component holding tools, the head moving device does not move the component mounting head, and each of the first component holding tool operating device and the second component holding tool operating device makes each of the plurality of component holding tools operated by the corresponding component holding tool operating device receive the component from the same position among the plurality of supply positions.

9. A component mounting machine comprising:
a board fixing device which fixes a printed circuit board;
a component supply device which supplies a component at a plurality of supply positions;
a component mounting head which includes (a) a rotating body which is rotatable around a rotation shaft line, (b) a plurality of component holding tools which are installed at an equivalent angle pitch on one circumference around the rotation shaft line, and which respectively hold a component, in the rotating body, and (c) a rotating body rotating device which rotates the rotating body which rotates the plurality of component holding tools along the circumference around the rotation shaft line;
a first component holding tool operating device which operates one component holding tool which is positioned at a first position set on the circumference among the plurality of component holding tools for holding and disengaging the component, and a second component holding tool operating device which operates one component holding tool which is positioned at a second position set on the circumference among the plurality of component holding tools for holding and disengaging the component; and
a head moving device which moves the component mounting head for receiving the component by the plurality of component holding tools from the component supply device, and for mounting the component held by the plurality of component holding tools onto the printed circuit board fixed by the board fixing device,
wherein the component supplied by the component supply device is mounted on the printed circuit board fixed by the board fixing device,
wherein the first position and the second position are set so that the second position is positioned in the middle of any two adjacent component holding tools among the plurality of component holding tools when one of the plurality of component holding tools is positioned at the first position, and
wherein, when mounting the component received by each of the plurality of component holding tools onto the printed circuit board, where the first position is close to the next mounting position on the printed circuit board, the first component holding tool operating device is used, and where the second position is close to the next mounting position, the second component holding tool operating device is used.

10. The component mounting machine according to claim 9,
wherein, when mounting the component received by each of the plurality of component holding tools onto the printed circuit board, only one of the first and the second component holding tool operating devices is used.

* * * * *